United States Patent [19]

Mizrahi et al.

[11] Patent Number: 5,875,273
[45] Date of Patent: Feb. 23, 1999

[54] LASER WAVELENGTH CONTROL UNDER DIRECT MODULATION

[75] Inventors: Victor Mizrahi, Columbia; Stephen R. Harmon, Severn, both of Md.

[73] Assignee: Ciena Corporation, Linthicum, Md.

[21] Appl. No.: 898,714

[22] Filed: Jul. 22, 1997

[51] Int. Cl.⁶ .................................................. G02B 6/34
[52] U.S. Cl. .................. 385/37; 385/27; 362/32
[58] Field of Search ..................... 385/27, 37, 14, 385/15, 39, 147; 372/6, 32, 102; 356/416

[56] References Cited

U.S. PATENT DOCUMENTS

| | | | |
|---|---|---|---|
| 5,077,816 | 12/1991 | Glomb et al. | 385/37 |
| 5,299,212 | 3/1994 | Koch et al. | 372/32 |
| 5,696,859 | 12/1997 | Onaka et al. | 385/24 |

OTHER PUBLICATIONS

McCadams et al., CLEO'97, Paper CThW6, pp. 447–448, No Month.

Woodward et al., *IEEE Photonics Technology Letters*, vol. 5, No. 6, Jun. 1993, pp. 628–630.

Lee et al., CLEO'95, Paper Ctu10, pp. 93–94, No Month.

Morton et al., OFC'96 Technical Digest, Paper TuH6, pp. 39–40, No Month.

*Primary Examiner*—Phan T. H. Palmer
*Attorney, Agent, or Firm*—David L. Soltz

[57] ABSTRACT

In accordance with the present invention, an in-fiber Bragg grating is coupled to the output of a directly modulated DFB laser. The output of the DFB laser is spectrally broadened, but has peak optical power at the channel wavelength. Typically, the grating is designed to have a substantially vertical "edge", i.e., segment of the transmissivity vs. wavelength characteristic, at a particular wavelength, between a transmission minimum and a transmission maximum. Amounts of light transmitted through and reflected by the grating are compared to adjust the channel wavelength to a desired wavelength at or near the edge of the grating.

26 Claims, 5 Drawing Sheets

LASER WAVELENGTH CONTROL UNDER DIRECT MODULATION

FIELD OF THE INVENTION

The present invention is directed to a system and related method for controlling the wavelength of light output from a directly modulated laser.

Optical communication systems are a substantial and fast growing constituent of communication networks. The expression "optical communication system," as used herein, relates to any system which uses optical signals to convey information across an optical waveguiding medium, for example, an optical fiber. Such optical systems include but are not limited to telecommunication systems, cable television systems, and local area networks (LANs). Optical systems are described in Gowar, Ed. *Optical Communication Systems*, (Prentice Hall, New York) c. 1993, the disclosure of which is incorporated herein by reference. Currently, the majority of optical communication systems are configured to carry an optical channel of a single wavelength over one or more optical waveguides. To convey information from plural sources, time-division multiplexing is frequently employed (TDM). In time-division multiplexing, a particular time slot is assigned to each signal source, the complete signal being constructed from the portions of the signals collected from each time slot. While this is a useful technique for carrying plural information sources on a single channel, its capacity is limited by fiber dispersion and the need to generate high peak power pulses.

While the need for communication services increases, the current capacity of existing waveguiding media is limited. Although capacity may be expanded e.g., by laying more fiber optic cables, the cost of such expansion is prohibitive. Consequently, there exists a need for a cost-effective way to increase the capacity of existing optical waveguides.

Wavelength division multiplexing (WDM) has been explored as an approach for increasing the capacity of existing fiber optic networks. WDM systems typically include a plurality of transmitters, each including a semiconductor laser diode respectively transmitting signals on a designated one of a plurality of channels or wavelengths. The channels are combined by a multiplexer at one end terminal and transmitted on a single fiber to a demultiplexer at another end terminal where they are separated and supplied to respective receivers.

Generally, a plurality of erbium doped fiber amplifiers are provided at nodes spaced along the fiber between the multiplexer and demultiplexer in order to regenerate the optical signal transmitted on the fiber. These erbium doped fibers optimally amplify in a relatively narrow range of wavelengths centered about 1550 nm. Thus, the semiconductor laser transmitters preferably transmit at respective wavelengths within this range. Since the transmitted wavelengths are relatively close to each other, typically less than 1 nm apart, these wavelengths must be precisely controlled in order to insure integrity of the transmitted information.

Frequently, each semiconductor laser transmitter (e.g. a distributed feedback, DFB, laser) is operated in a continuous-wave (CW) mode, and an external modulator, such as a Mach-Zehnder interferometer, is used to generate a series of optical pulses corresponding to the communication data. While such schemes allow the wavelength of the emitted light to be readily controlled, the external modulator adds considerable expense.

An alternative solution involves direct modulation of the semiconductor laser transmitters, in which the semiconductor laser transmitters are turned "on" and "off" in accordance with the communication data. In the "on" state, a relatively large bias is applied across the semiconductor laser transmitter, while in the "off" a relative low bias is supplied and a small amount of light is output. Such changes in applied voltage result in corresponding changes in the carrier concentration within the semiconductor laser transmitter, which, in turn, alter output wavelength. The optical spectrum of a directly modulated semiconductor laser transmitter is thus spectrally broadened or "chirped", as shown in FIG. 1.

Typically, the chirped output has a peak optical power 101 at a single wavelength, which can be used as a one of the channel wavelengths in a WDM system. Due to the above-described spectral broadening, however, the channel wavelength of a directly modulated laser is difficult to stabilize and control.

SUMMARY OF THE INVENTION

Consistent with the present invention, an optical device is provided including a laser having a peak optical power at a first wavelength. A filtering element is coupled to the laser and has a transmission characteristic as a function of wavelength. The transmission characteristic has a transmissivity minimum over a range of transmissivity minimum wavelengths, a transmissivity maximum over a range of transmissivity maximum wavelengths, and a substantially vertical slope at a second wavelength between the ranges of transmissivity minimum and maximum wavelengths. Additionally, a control circuit is provided for adjusting the first wavelength to be within the range of transmissivity minimum and maximum wavelengths.

BRIEF DESCRIPTION OF THE DRAWINGS

Advantages of the present invention will be apparent from the following detailed description of the presently preferred embodiments thereof, which description should be considered in conjunction with the accompanying drawings in which.

DETAILED DESCRIPTION

In accordance with the present invention, an in-fiber Bragg grating is coupled to the output of a directly modulated DFB laser. The output of the DFB laser is spectrally broadened, as noted above, and has peak optical power at the nominal channel wavelength. Typically, the grating is designed to have a substantially vertical "edge", i.e., segment of the transmissivity vs. wavelength characteristic, at a particular wavelength, between a transmission minimum and a transmission maximum. Amounts of light transmitted through and reflected by the grating are compared to adjust the channel wavelength to a desired wavelength at or near the edge of the grating.

Figure 2:
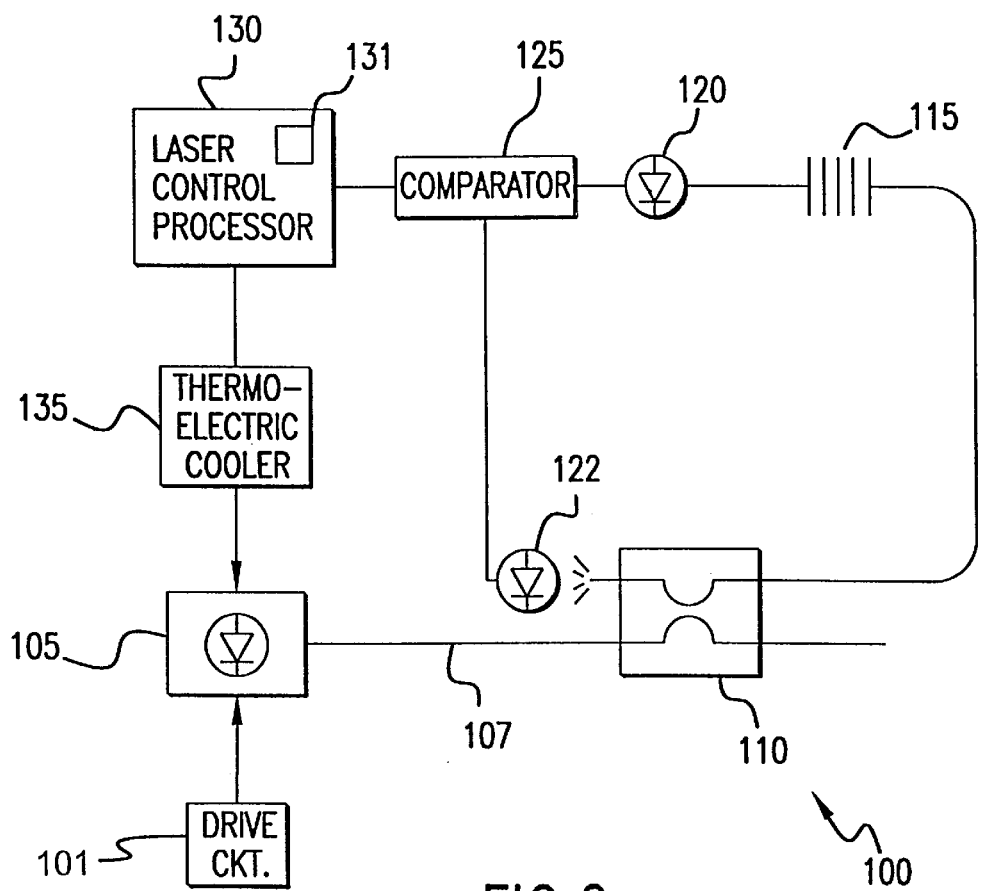
FIG. 2 illustrates a laser wavelength control device in accordance with a first embodiment of the present invention.

Turning to the drawings in which like reference characters indicate the same or similar elements in each of the several views, FIG. 2 illustrates a laser wavelength control device 100 in accordance an embodiment of the present invention. Laser wavelength control device 100 typically includes a semiconductor DFB laser diode 105 generally comprising one or more III-V semiconductor materials commercially available from a wide variety of suppliers such as Fujitsu, Alcatel, Lucent, and Hewlett-Packard. DFB laser 105 is directly modulated by laser drive circuit in a conventional manner to generate a series of light pulses corresponding to the transmitted communication data.

Light output from DFB laser 105 is supplied via fiber 107 to directional coupler 110, which diverts a portion of the transmitted light, e.g. 5%, to a filtering element, typically in-fiber Bragg grating 115 commercially available from Sumitomo Electric Industries, Ltd. and 3M Specialty Optical Fibers, for example. A first portion of the diverted light is transmitted through grating 115 to photodetector while a second portion is reflected back through coupler 110 to photodetector 122. Photodetectors 120 and 122, respectively, generate electrical signals in response to the first and second portions of light. These electrical signals are supplied to a comparator circuit, including, for example, a differential amplifier. The comparator circuit, in turn, outputs a comparison signal to laser control processor 130 (typically a general purpose microprocessor such as a 68302 microprocessor manufactured by Motorola). Based on the comparison signal, a program stored in processor 130 supplies an output voltage signal to thermo-electric heater 135, which sets the temperature of DFB laser 105 in accordance with the received output voltage.

Generally, the wavelength of light output from DFB laser 105 is inversely related to the temperature of DFB laser 105. Accordingly, by changing the temperature of thermo-electric cooler 132, processor 130 can alter the wavelength of light output from DFB laser 105.

A detailed description of a method of controlling DFB laser 105 will be presented below with reference to FIGS. 2–4. In accordance with one aspect of the present invention, the method is carried out in accordance with the program stored in processor 130.

Figure 3:
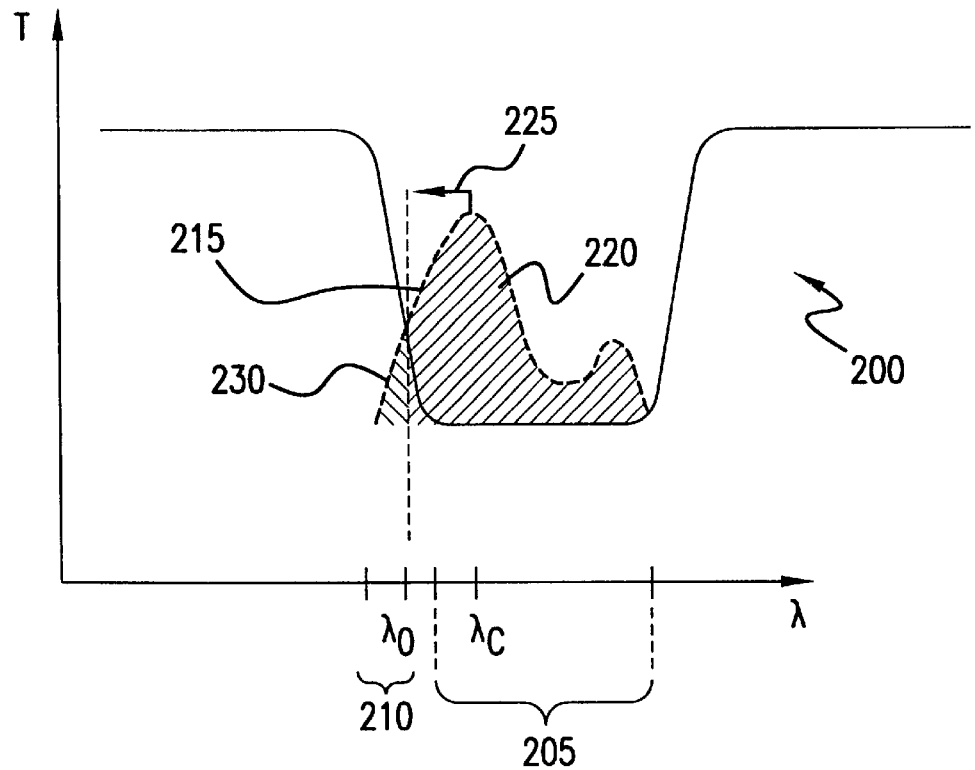
FIGS. 3 and 4 illustrate a transmissivity characteristic of an in-fiber Bragg grating and optical spectra of a DFB laser in accordance with the present invention.

As seen in FIG. 3, grating 115 has a transmission characteristic 200 (and a complementary reflectivity characteristic) which is low or at a minimum (e.g. 5%) and substantially constant over a relatively wide range of wavelengths between a desired wavelength, $\lambda_0$, and $\lambda_C$. At $\lambda_0$, the characteristic typically has a substantially vertical slope, for example at least 2–5 GHz/dB, and for wavelengths greater than $\lambda_1$, and less than $\lambda_0$, the transmission characteristic is high (e.g., 90%) or at a maximum. DFB laser 105 emits at peak optical power at channel wavelength $\lambda_c$, as indicated by optical spectrum curve 215 superimposed on the transmission characteristic in FIG. 3. The optical spectrum of DFB laser 105 at 10% peak power is typically at least equal to half the difference between a wavelength associated with 90% peak transmissivity and a wavelength associated with 10% peak transmissivity of grating 115 to insure proper locking of laser 105 to a particular wavelength, as discussed in greater detail below.

As further shown in FIG. 3, optical power or light intensity at wavelengths within range 205, as represented by region 220 beneath curve 215, is within the transmission minimum and is reflected by grating 115 to photodetector 122, while optical power at wavelengths within range 210, as represented by region 230 beneath curve 215, is transmitted through grating 115 and sensed by photodetector 120.

Since $\lambda_C$ is offset from $\lambda_0$, the electrical signal (e.g., current) generated by photodetector 122 exceeds the electrical signal generated by photodetector 120, as shown by the larger area of region 220 relative to region 230 in FIG. 3. Comparator circuit 125, therefore, outputs a comparison signal (e.g., a voltage) to processor 130 corresponding in magnitude and polarity to the difference in optical power received by photodetectors 120 and 122. Processor 130, in turn, retrieves a control voltage adjustment in a memory 131, such as a look-up table, corresponding to the received comparison signal. Alternatively, the control voltage adjustment can be determined based upon a formula, such as a proportional integral derivative (PID) formula. Processor 130 then outputs a control voltage to thermoelectric cooler 135, which adjusts the temperature of DFB laser 105 to thereby shift the wavelength $\lambda_C$ in an amount and direction indicated by arrow 225. Preferably, the range of wavelengths between $\lambda_0$ and $\lambda_1$ is greater than the optical spectrum of DFB laser 105 to insure that $\lambda_C$ is adjusted to the edge at $\lambda_0$ instead of the edge at $\lambda_1$.

Figure 4:
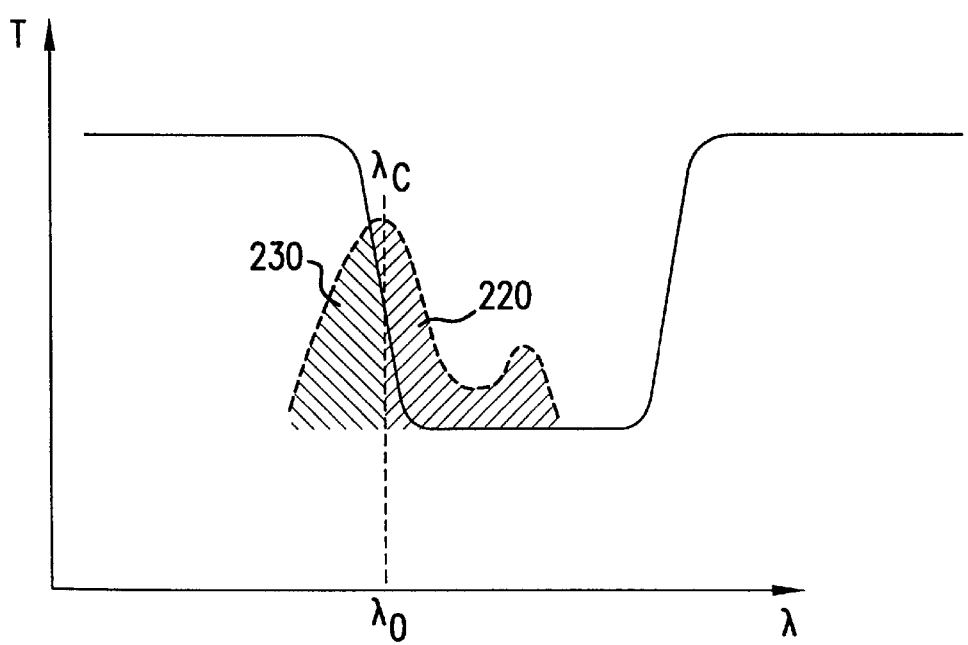

As a result, the ratio of optical power transmitted through grating 115 (area of region 230) to optical power reflected by the grating (area of region 220) is adjusted to correspond to the condition under which $\lambda_C$ equals $\lambda_0$, as shown in FIG. 4, to thereby "lock" laser 105 to $\lambda_0$. Preferably, processor 130 continuously monitors the output of comparator 125, and adjusts the wavelength of DFB laser 105 to maintain the desired ratio of output optical power. For example, if the desired ratio of output optical power is set to one $\lambda_C$ is adjusted to a wavelength $\lambda_0$ whereby the amount of optical power reflected by the grating is the same as that transmitted through the grating. Other ratios may also be set as well. Thus, $\lambda_C$ can be precisely set to a single desired wavelength by appropriately selecting a particular ratio of transmitted to reflected optical power. The grating position, i.e., the location of the edge of the grating can also be used to set $\lambda_C$.

While wavelength control based upon the ratio of transmitted to reflected power has been discussed above, it is within the scope of the present invention to control laser wavelength based on the reflected to transmitted optical power as well. Typically, however, the channel wavelength is set to fall outside the range of wavelengths associated with the transmission minimum of grating 115, and is at most equal to wavelength associated with the lower wavelength edge of the grating, e.g., $\lambda_0$ above. Nevertheless, if necessary, the channel wavelength may also be tuned to be at least equal upper wavelength edge of grating 115 corresponding to $\lambda_1$ (see FIG. 3).

Figure 1:
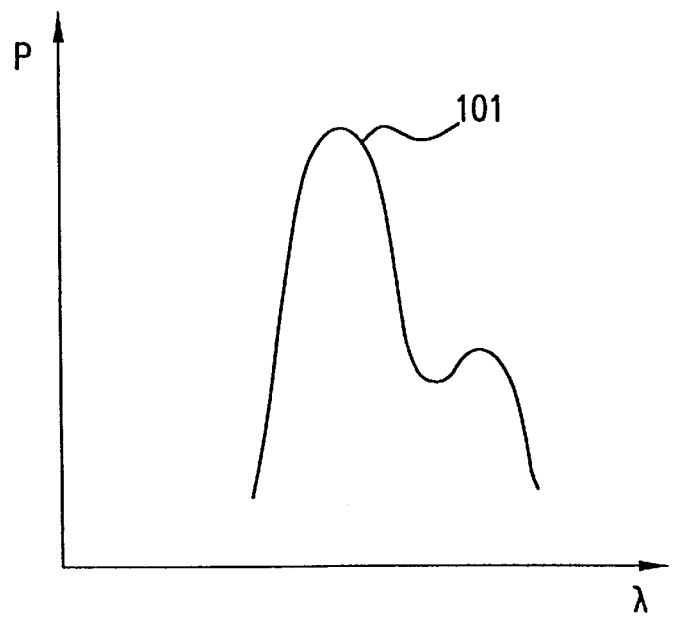
FIG. 1 illustrates a typical optical spectrum of a conventional directly modulated DFB laser.
Figure 5:
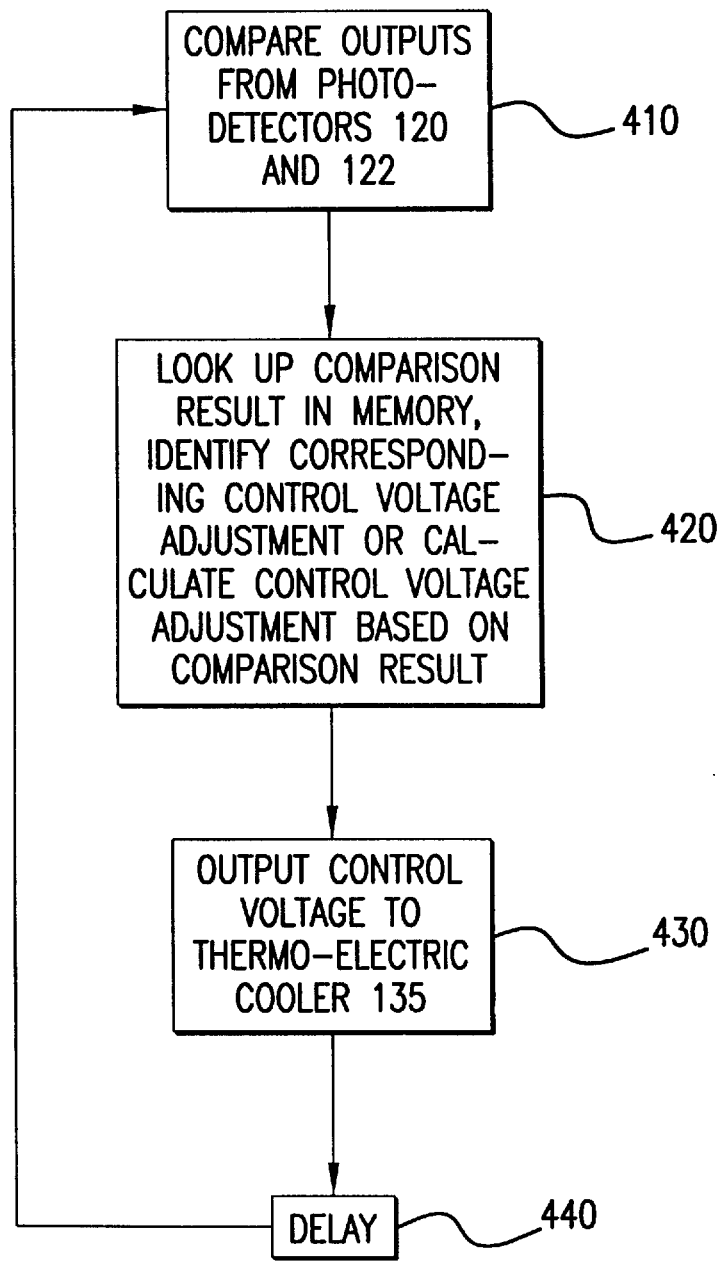
FIG. 5 illustrates a flow-chart for a program for carrying out a method for controlling a wavelength of light output from a laser in accordance with a second embodiment of the present invention.

In accordance with a second embodiment of the present invention, comparator 125 in FIG. 1 is omitted, and the outputs of photodetectors 120 and 125 are supplied directly to processor 130. Accordingly, processor 130 can contain a program which carries out the following steps shown in FIG. 5. Namely, the program fist compares the outputs from photodetectors 120 and 122 in step 410. Next, in step 420, the comparison result can be used to identify a corresponding control voltage adjustment stored in a look-up table, for example. An output control voltage corresponding to the control voltage adjustment is then output to thermo-electric cooler 135 to adjust the temperature, and thus the wavelength of DFB laser 105 in step 430 so that the desired ratio of transmitted to reflected optical power by grating 115 is obtained. Optionally, a delay (step 440) can be provided in the program to allow the wavelength of DFB laser 105 to stabilize prior to comparing the outputs of photodetectors 120 and 122 again (step 410). As seen in FIG. 5, the program typically cycles through steps 410, 420, 430 and 440, thereby insuring that the channel wavelength $\lambda_C$ remains set to the desired wavelength $\lambda_0$.

Figure 6:
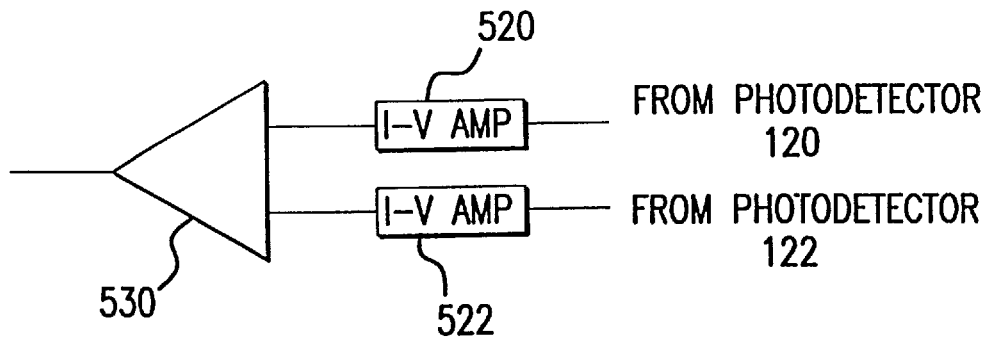
FIG. 6 is schematic diagram of an electrical circuit incorporated into a third embodiment of the present invention.

A third embodiment of the present invention will next be described in conjunction with FIG. 6. In accordance with the third embodiment, processor 130 is omitted, and replaced by hardwired circuitry. For example, as shown in FIG. 6, the outputs of photodetectors 120 and 122 are respectively supplied to current-to-voltage operational amplifiers 520 and 522, which convert the received current signals to voltages. The respective gains of the photodetectors are preferably set so that equal currents are respectively output when $\lambda_C$ equals $\lambda_0$. The voltage outputs generated by amplifiers 520 and 522 are supplied to a differential amplifier 530, which is configured to output an appropriate voltage for driving thermo-electric cooler135.

Figure 7:
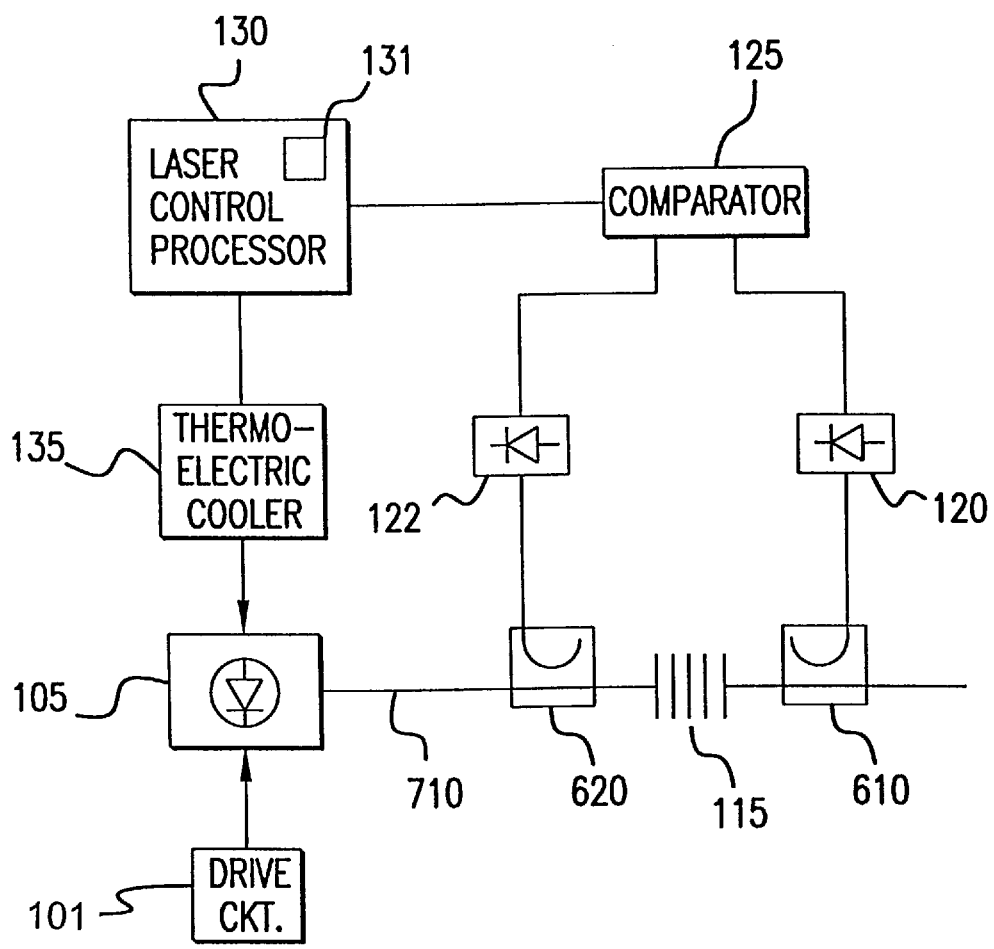
FIG. 7 illustrates a fourth embodiment of the present invention.

In accordance with a fourth embodiment of the present invention, grating 115 receives substantially the entire optical output from laser 105. For example, as seen in FIG. 7, the fourth embodiment is similar to the first embodiment shown in FIG. 2, with the exception that the optical output from laser 105 is supplied directly to a fiber 710 having grating 115 embedded therein. In this configuration, grating 115 is said to be "in transmission". Couplers 610 and 620 respectively tap off 2% of the optical power, for example, to photodetectors 120 and 122. The operation of the laser control device in accordance with the fourth embodiment is similar to that described above in regard to the first embodiment.

Figure 8:
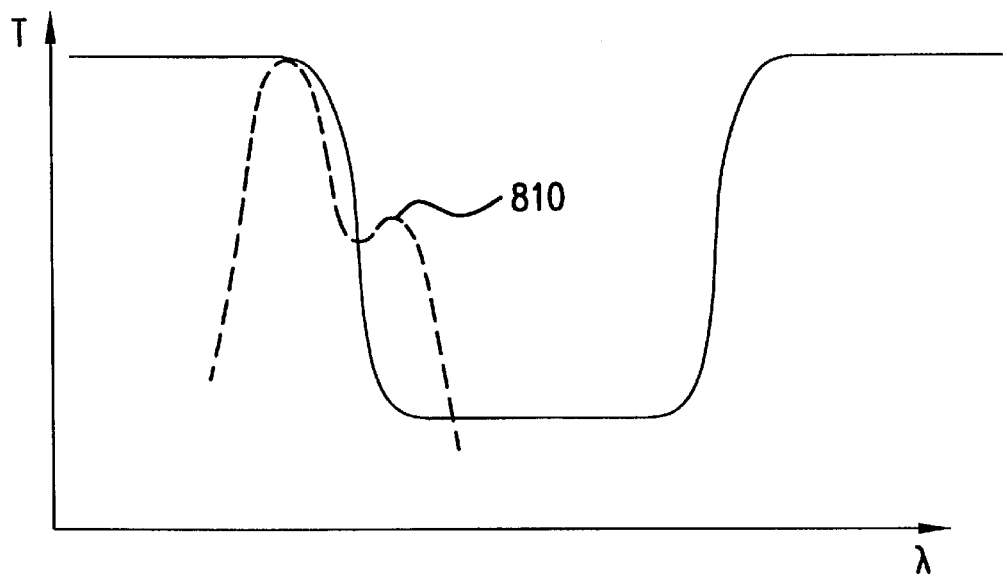
FIG. 8 illustrates a transmissivity characteristic of an in-fiber Bragg grating and optical spectrum of a directly modulated DFB laser in accordance with the fourth embodiment of the present invention.
Figure 9:
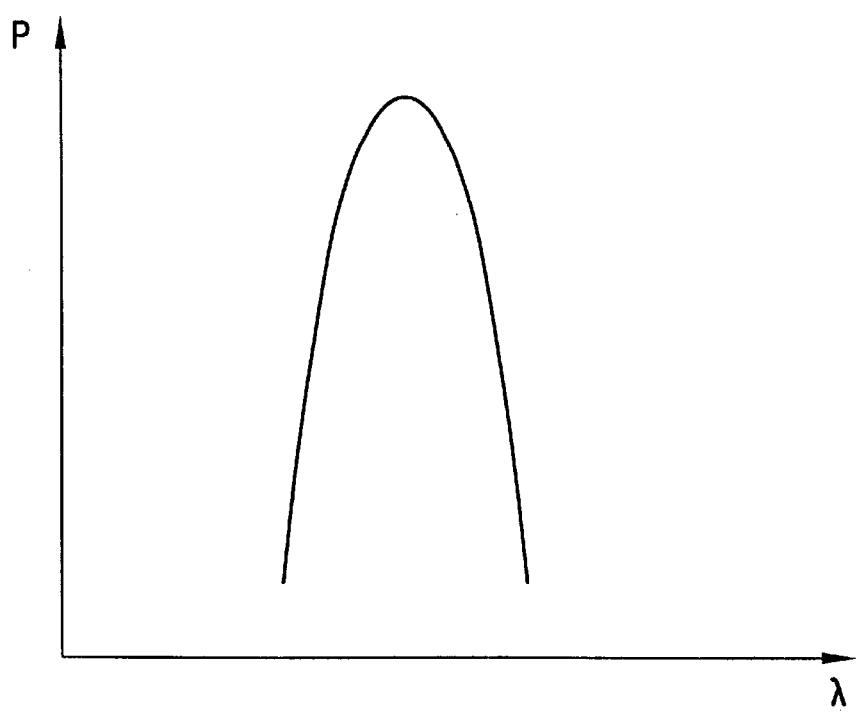
FIG. 9 illustrates an optical spectrum of light transmitted through a grating in accordance with the fourth embodiment of the present invention.

The fourth embodiment, however, is advantageous in that grating 115 acts to eliminate a chirped portion 810 (see FIG. 8) of the output of laser 105. The chirped portion of the light constitutes blue-shifted light which travels at a different speed down the fiber than the light within the main peak 101 (see FIG. 1). Thus, light from one pulse can overlap with another pulse at the receiving end of an optical fiber causing increased bit error rate probabilities. As shown in FIG. 8, however, the ratio of transmitted to reflected optical power by grating 115 can be monitored to adjust the channel wavelength to be slightly offset from the substantially vertical edge of grating 115. As a result, the chirped portion of the output light is reflected back and eliminated from the spectrum of the transmitted light, as seen in FIG. 9, and reduced bit error rate probabilities can thus be achieved.

While the foregoing invention has been described in terms of the embodiments discussed above, numerous variations are possible. Accordingly, modifications and changes such as those suggested above, but not limited thereto, are considered to be within the scope of the following claims.

What is claimed is:

1. An optical device comprising:
    a source of light, said light having an optical spectrum with a peak optical power at a peak wavelength;
    a filtering element coupled to said source of light, said filtering element having a transmission characteristic and a complementary reflectivity characteristic as a function of wavelength, said transmission characteristic having a transmissivity minimum at a minimum transmissivity wavelength, a first transmissivity maximum at a first maximum transmissivity wavelength less than said minimum transmissivity wavelength, and a second transmissivity maximum at a second maximum transmissivity wavelength greater than said minimum transmissivity wavelength;
    a first photodetector configured to sense a first portion of said light reflected by said filtering element and generating a first sense signal in response thereto;
    a second photodetector configured to sense a second portion of said light transmitted through said filtering element and generating a second sense signal in response thereto; and
    a control circuit adjusting said peak wavelength based on said first and second sense signals to be within one of a first range of wavelengths less than a first intermediate wavelength and a second range of wavelengths greater than a second intermediate wavelength, said first intermediate wavelength being between said minimum transmissivity wavelength and said first maximum transmissivity wavelength, and said second intermediate wavelength being between said minimum transmissivity wavelength and said second maximum transmissivity wavelength.

2. An optical device in accordance with claim 1, said control circuit further comprising:
    a comparison circuit coupled to said first and second photodetectors and generating a comparison signal in response to said first and second sense signals, said control circuit adjusting said first wavelength in accordance with said comparison signal.

3. An optical device in accordance with claim 2, further comprising:
    an optical fiber having a first end portion coupled to an output of said source, said filtering element being connected to a second end portion of said optical fiber.

4. An optical device in accordance with claim 4, further comprising:
    a first optical fiber coupled to an output of said source; and
    an optical directional coupler having a first port connected to said optical fiber;
    a second optical fiber connected to a second port of said optical directional coupler;
    a third optical fiber connecting said filtering element with a third port of said optical directional coupler; and
    a fourth optical fiber connected between said second photodetector and a fourth port of said optical directional coupler.

5. An optical device in accordance with claim 2, wherein said comparison circuit comprises a differential amplifier.

6. An optical device in accordance with claim 1, wherein said peak wavelength is dependent upon a temperature of said source of light, said control circuit generating an output signal in response to said first and second sense signals, said control circuit further comprises:
    a temperature regulating element coupled to said source of light, said temperature regulating element controlling a temperature of said source in response to said output signal, thereby adjusting said peak wavelength.

7. An optical device in accordance with claim 6, wherein said comparison circuit comprises a processor programmed to compare said first and second sense signals and generate said output signal in response thereto.

8. An optical device in accordance with claim 1, wherein said filtering element comprises an in-fiber Bragg grating.

9. An optical device in accordance with claim 1, wherein said source of light comprises a semiconductor laser, said optical device further comprising:
   a drive circuit coupled to said semiconductor laser for directly modulating said semiconductor laser.

10. An optical device in accordance with claim 1, wherein said optical spectrum further comprises a subsidiary peak of optical power at a subsidiary peak wavelength, a transmissivity of said subsidiary peak wavelength being less than a transmissivity of said peak wavelength through said filtering element.

11. An optical device, comprising:
   a semiconductor light emitting device, a light output from said semiconductor light emitting device having an optical spectrum with a peak optical power at a peak wavelength;
   a filtering element coupled to said semiconductor light emitting device, said filtering element having a transmission characteristic as a function of wavelength, said transmission characteristic having a transmissivity minimum and a transmissivity maximum, said source of light having a full spectral width at 10% of said peak optical power at least equal to one half a difference between a first wavelength having a first transmissivity of 10% of said transmissivity maximum through said filtering element and a second wavelength having a second transmissivity of 90% of said transmissivity maximum through said filtering element; and
   a control circuit coupled to said semiconductor light emitting device adjusting said peak wavelength to be different than a wavelength associated with said transmissivity minimum.

12. An optical device, comprising:
   a laser emitting light, said light having a peak optical power at a peak wavelength;
   a drive circuit coupled to said laser for directly modulating said laser;
   an optical fiber having an end portion coupled to said laser and receiving said light;
   a Bragg grating embedded in said optical fiber, said Bragg grating being configured to filter chirp-induced wavelengths in said light, and having a transmissivity characteristic and a complementary reflectivity characteristic as a function of wavelength, said transmissivity characteristic having a first transmissivity over a range of transmissivity minimum wavelengths and a second transmissivity greater than said first transmissivity over a range of transmissivity maximum wavelengths, said transmissivity characteristic further having a sloped portion between said ranges of transmissivity minimum and maximum wavelengths; and
   a control circuit coupled to said Bragg grating and said laser, said control circuit adjusting said peak wavelength to lie outside said range of transmissivity minimum wavelengths.

13. An optical device comprising:
   a laser emitting light, said light having a peak optical power at a first wavelength;
   a filtering element coupled to said laser, said filtering element having a transmission characteristic and a complementary reflectivity characteristic as a function of wavelength, said transmission characteristic having a first transmissivity over a range of transmissivity minimum wavelengths, a second transmissivity greater than said first transmissivity over a range of transmissivity maximum wavelengths, and a sloped portion at a second wavelength between said ranges of transmissivity minimum and maximum wavelengths;
   means for comparing a first portion of said light transmitted through said filtering element with a second portion of said light reflected by said filtering element; and
   means for adjusting, in response to a comparison result output from said comparison means, said first wavelength to equal a second wavelength lying outside said range of transmission minimum wavelengths.

14. An optical device in accordance with claim 13, wherein said filtering element comprises an in-fiber Bragg grating.

15. An optical device in accordance with claim 13, wherein said first wavelength is dependent upon a temperature of said laser, said adjusting means further comprising means for controlling a temperature of said laser to thereby adjust said first wavelength.

16. An optical device in accordance with claim 13, further comprising:
   a memory storing a plurality of output voltage adjustments and a plurality of comparison results, each of said output voltage adjustments corresponding to a respective one of said plurality of comparison results; and
   means for identifying said comparison result output with one of said plurality of comparison results;
   means for retrieving an output voltage adjustment corresponding to said one of said plurality of comparison results;
   means for generating an output voltage corresponding to said retrieved output voltage adjustment; and
   means for supplying said output voltage to a temperature regulator coupled to said laser to control a temperature of said laser, and thereby control said first wavelength of said laser.

17. An optical device in accordance with claim 13, further comprising means for directly modulating said laser.

18. An optical device in accordance with claim 13, further comprising:
   means for calculating an output voltage adjustment based on said comparison result output;
   means for generating said output voltage in response to said calculation;
   means for supplying said output voltage to a temperature regulator coupled to said laser to control a temperature of said laser, and thereby control said first wavelength of said laser.

19. A method of regulating a wavelength of light output from a laser, said laser having an optical spectrum with a peak optical power at a first wavelength, said method comprising the steps of:
   directing said light toward a filtering element, said filtering element having a transmission characteristic and a complementary reflectivity characteristic as a function of wavelength, said transmission characteristic having a first transmissivity over a range of transmissivity minimum wavelengths, a second transmissivity greater than said first transmissivity over a range of transmissivity maximum wavelengths, and a sloped portion at a second wavelength between said ranges of transmissivity minimum and maximum wavelengths; and comparing a first portion of said light transmitted through said filtering element with a second portion of said light reflected by said filtering element; and adjusting said first wavelength of said light, based on said comparison, to lie outside said range of transmission minimum wavelengths.

20. A method in accordance with claim 19, wherein said first wavelength is dependent upon a temperature of said laser, said adjusting step further comprises the steps of:

calculating a voltage adjustment based on a result of said comparison;

generating a voltage corresponding to said voltage adjustment; and supplying said voltage to a temperature regulator coupled to said laser to control a temperature of said laser, and thereby control said first wavelength of said laser.

21. A method in accordance with claim 20, wherein said calculating step is performed using a proportional integral derivative.

22. A method in accordance with claim 19, wherein said first wavelength is dependent upon a temperature of said laser, said adjusting step further comprising the step of controlling a temperature of said laser to thereby adjust said first wavelength of said light.

23. A method in accordance with claim 19, wherein said first wavelength is dependent upon a temperature of said laser, said adjusting step further comprises the steps of:

retrieving a voltage adjustment stored in a memory, said voltage adjustment corresponding to a result of said comparison;

generating a voltage corresponding to said voltage adjustment; and supplying said voltage to a temperature regulator coupled to said laser to control a temperature of said laser, and thereby control said first wavelength of said laser.

24. A method in accordance with claim 19, further comprising the step of directly modulating said laser.

25. A method in accordance with claim 19, wherein said adjusting step further comprises adjusting said first wavelength to be less than each wavelength within said range of minimum transmissivity wavelengths and at most equal to said second wavelength.

26. A method in accordance with claim 19, wherein said filtering element comprises an in-fiber Bragg grating.

* * * * *